United States Patent
Jeong et al.

(10) Patent No.: US 7,826,583 B2
(45) Date of Patent: Nov. 2, 2010

(54) CLOCK DATA RECOVERY APPARATUS

(75) Inventors: Chun-Seok Jeong, Kyoungki-do (KR);
Jae-Jin Lee, Kyoungki-do (KR);
Chang-Sik Yoo, Kyoungki-do (KR);
Jung-June Park, Kyoungki-do (KR);
Young-Suk Seo, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 670 days.

(21) Appl. No.: 11/819,807

(22) Filed: Jun. 29, 2007

(65) Prior Publication Data

US 2008/0101524 A1    May 1, 2008

(30) Foreign Application Priority Data

Oct. 31, 2006    (KR) .................. 10-2006-0106144

(51) Int. Cl.
*H03D 3/24* (2006.01)
*H04L 7/00* (2006.01)
*H04L 25/00* (2006.01)
*H04L 25/40* (2006.01)

(52) U.S. Cl. .................. 375/376; 375/354; 375/371; 375/373

(58) Field of Classification Search ............ 375/376, 375/354, 371, 373
See application file for complete search history.

(56) References Cited

U.S. PATENT DOCUMENTS

| 5,059,833 | A * | 10/1991 | Fujii ........................ 327/7 |
| 6,173,432 | B1 | 1/2001 | Harrison |
| 6,208,183 | B1 * | 3/2001 | Li et al. .................. 327/161 |
| 6,252,444 | B1 | 6/2001 | Lee |
| 6,597,218 | B1 * | 7/2003 | Gauthier et al. .......... 327/158 |

(Continued)

FOREIGN PATENT DOCUMENTS

JP    2001-320353    11/2001

(Continued)

OTHER PUBLICATIONS

Korean Notice of Allowance issued in Korean Patent Application No. KR 10-2006-0106144, dated May 23, 2008.

(Continued)

*Primary Examiner*—David C Payne
*Assistant Examiner*—Erin M File
(74) *Attorney, Agent, or Firm*—IP & T Group LLP (57) ABSTRACT

A clock data recovery apparatus includes a phase looked loop unit, a voltage control delay line, a phase detection unit, a charge pump unit, and a loop filter unit. The phase looked loop unit outputs a plurality of clock signals which are different from each other in phase and of which frequency is lower than that of data. The voltage control delay line outputs recovered clock signals by delaying the clock signals according to input voltage levels. The phase detection unit outputs recovered data in synchronization with the clock signals, respectively and outputs increment and decrement signals which have wider pulse width than the data by comparing the recovered clock signals with the data. The charge pump unit outputs a corresponding current in response to the increment and decrement signals. The loop filter unit determines an amount of delay in the voltage control delay line by outputting the voltage.

11 Claims, 9 Drawing Sheets

U.S. PATENT DOCUMENTS

| | | | |
|---|---|---|---|
| 6,775,345 B1 | 8/2004 | Song | |
| 6,788,045 B2 * | 9/2004 | Gauthier et al. | 324/76.53 |
| 6,812,758 B2 * | 11/2004 | Gauthier et al. | 327/158 |
| 6,825,731 B2 * | 11/2004 | Hasegawa | 331/57 |
| 6,931,086 B2 * | 8/2005 | Harrison | 375/374 |
| 6,952,462 B2 * | 10/2005 | Harrison | 375/373 |
| 7,057,432 B2 * | 6/2006 | Yoo et al. | 327/158 |
| 7,061,290 B2 * | 6/2006 | Hasegawa | 327/157 |
| 7,127,017 B1 | 10/2006 | Evans et al. | |
| 7,129,800 B2 * | 10/2006 | Gauthier et al. | 331/175 |
| 7,134,036 B1 * | 11/2006 | Guan | 713/500 |
| 7,236,028 B1 * | 6/2007 | Choi | 327/158 |
| 7,251,305 B2 * | 7/2007 | Gauthier et al. | 375/376 |
| 7,567,629 B2 * | 7/2009 | Fredriksson | 375/326 |
| 7,592,877 B2 * | 9/2009 | Shiramizu et al. | 331/57 |
| 7,602,876 B2 * | 10/2009 | Harrison | 375/375 |
| 2002/0140504 A1 * | 10/2002 | Hasegawa | 330/57 |
| 2003/0227989 A1 | 12/2003 | Rhee et al. | |
| 2004/0155696 A1 * | 8/2004 | Gauthier et al. | 327/530 |
| 2005/0168255 A1 * | 8/2005 | Gauthier et al. | 327/161 |
| 2006/0076991 A1 * | 4/2006 | Yoo et al. | 327/158 |
| 2006/0268958 A1 * | 11/2006 | Sindalovsky et al. | 375/130 |
| 2007/0009066 A1 * | 1/2007 | Fredriksson | 375/326 |
| 2008/0101524 A1 * | 5/2008 | Jeong et al. | 375/376 |

FOREIGN PATENT DOCUMENTS

| | | |
|---|---|---|
| KR | 1999-0065351 | 8/1999 |
| KR | 10-2003-0086107 A | 11/2003 |
| KR | 10-2005-0014926 A | 2/2005 |

OTHER PUBLICATIONS

US 7,137,024, 11/2006, James (withdrawn)

* cited by examiner

DT0 = (D0⊕D1)·CK0     DT4 = (D4⊕D5)·$\overline{CK0}$
CT0 = (Q0⊕Q1)·CK2     CT4 = (Q4⊕Q5)·$\overline{CK2}$
DT1 = (D1⊕D2)·CK1     DT5 = (D5⊕D6)·$\overline{CK1}$
CT1 = (Q1⊕Q2)·CK3     CT5 = (Q5⊕Q6)·$\overline{CK3}$
DT2 = (D2⊕D3)·CK2     DT6 = (D6⊕D7)·$\overline{CK2}$
CT2 = (Q2⊕Q3)·$\overline{CK0}$   CT6 = (Q6⊕Q7)·CK0
DT3 = (D3⊕D4)·CK3     DT7 = (D7⊕D8)·CK3
CT3 = (Q3⊕Q4)·$\overline{CK1}$   CT7 = (Q7⊕Q8)·$\overline{CK1}$

CLOCK DATA RECOVERY APPARATUS

CROSS-REFERENCE TO RELATED APPLICATIONS

The present invention claims priority of Korean patent application no. 10-2006-0106144, filed in the Korean Patent Office on Oct. 31, 2006, which is incorporated by reference in its entirety.

BACKGROUND OF THE INVENTION

The present invention relates to a clock data recovery apparatus used in a data receiving system which receives data in a high-speed transmission system such as a chip or fiber-optic based communication system; and, more particularly, to a clock data recovery apparatus capable of stably operating in high frequency clocks.

As the communication system between chips is highly integrated with large capacity, demand on high and fast system integration increases. A transmission method which sends data information without clock synchronization has been used at a transmitting side because of the complexity of hardware, power consumption and cost. Accordingly, a receiving side of the communication system needs a clock signal capable of exactly recovering distorted data which are caused by a limited bandwidth on a channel thereof. At the time of transmitting mass data, this clock signal becomes more and more important, but an apparatus which stably creates the clock signal in synchronization with the receiving data can considerably influence the performance of the system. Accordingly, a clock data recovery apparatus is required to extract stable clock signals from the transmitted data.

Figure 1:
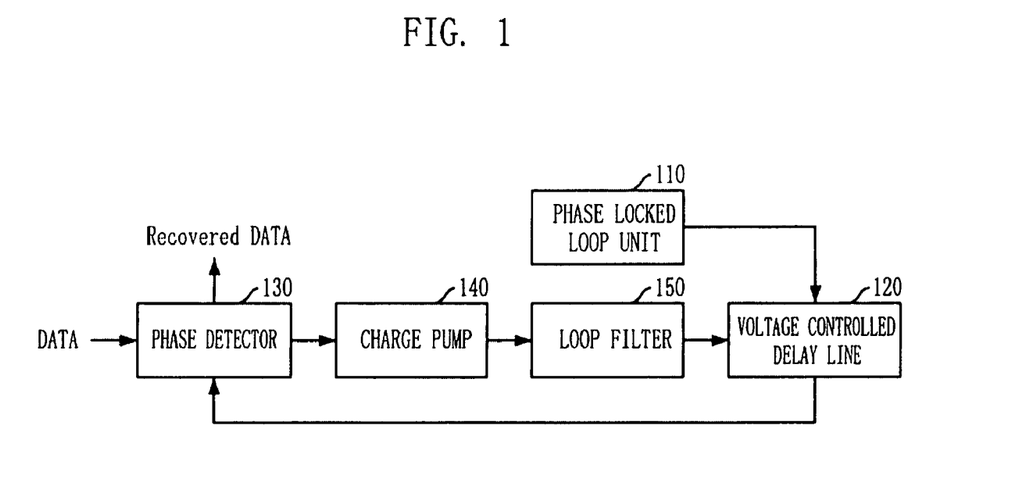
FIG. 1 is a block diagram illustrating a conventional clock data recovery apparatus.

FIG. 1 is a block diagram illustrating a conventional clock data recovery apparatus. Referring to FIG. 1, the conventional clock data recovery apparatus includes a phase locked loop (PLL) unit 110, a voltage controlled delay line (VCDL) 120, a phase detector 130, a charge pump 140 and a loop filter 150.

The phase locked loop unit 110 receives a reference clock signal and then outputs a stable clock signal with a constant frequency into the voltage controlled delay line 120.

The voltage controlled delay line 120 receives the clock signal from the phase locked loop unit 110 and controls an amount of delay of the clock signal based on an input voltage.

A timing information between the data and the clock signal, which are produced by the phase detector 130, is inputted into the voltage controlled delay line 120 via the charge pump 140 and the loop filter 150 and the voltage controlled delay line 120 controls a clock signals in order to make the data matched with the clock signal by delaying a clock signal based on the received timing information.

The phase detector 130 receives the clock signal and the data outputted from the voltage controlled delay line 120 and then compares a phase of the clock signal to a phase of the data. The result of the comparison, as an increment signal (UP) and a decrement signal (DOWN), is outputted to the charge pump 140. Also, the phase detector 130 outputs a recovered data which is synchronized with the clock signal and, in synchronization with the clock signal, a rising edge of the clock signal is arranged in the middle of the data pulse. That is, the phase detector 130, as shown in FIG. 1, functions as a retimer for recovering the data as well as the phase detection.

The charge pump 140 receives the increment signal (UP) and the decrement signal (DOWN) from the phase detector 130 and outputs current for executing a charging or discharging operation to the loop filter 150.

The loop filter 150 determines an amount of delay by outputting to the voltage controlled delay line 120 a voltage with a smooth variation which is converted by the current from the charge pump 140.

The clock data recovery apparatus controls the rising edge outputted from the phase locked loop unit 110 in such a manner that the rising edge is arranged in the middle of the data pulse. Accordingly, the finally recovered clock signal is outputted by the voltage controlled delay line 120 and the recovered data are outputted by the phase detector 130.

Figure 2:
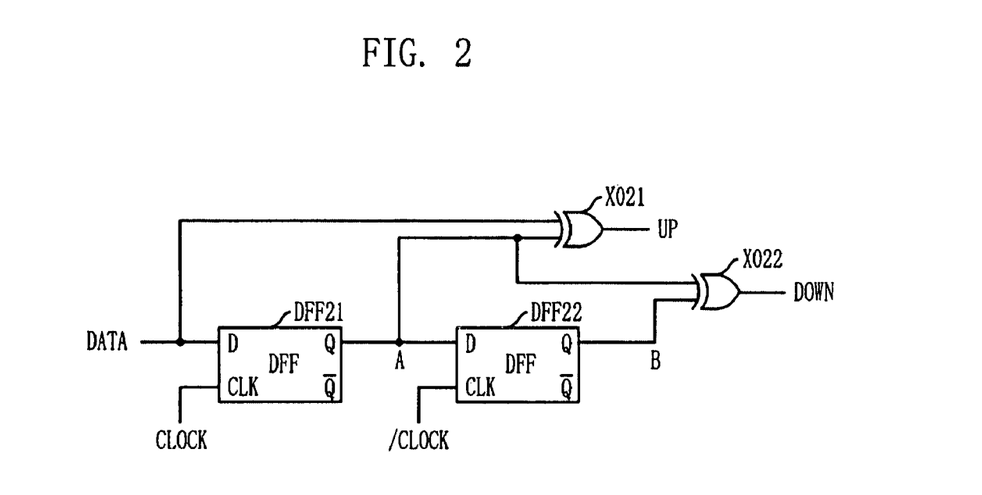
FIG. 2 is a block diagram illustrating a phase detector in the conventional clock data recovery apparatus of FIG. 1.

FIG. 2 is a block diagram illustrating the phase detector in the conventional clock data recovery apparatus of FIG. 1 and FIGS. 3A to 3C are timing charts showing an operation the phase detector of FIG. 2.

As shown in FIG. 2, the phase detector 130 includes a first D flip-flop DFF21 having an input terminal (D) to receive the data and a clock terminal (CLK) to which the clock signal is applied, a second D flip-flop DFF22 having an input terminal (D) to receive an output of the first D flip-flop DFF21 and a clock terminal (CLK) to which an inverted clock signal is applied, a first XOR gate XO21 for XORing the data and the output of the first D flip-flop DFF21, and a second XOR gate XO22 XORing the outputs of the first and second D flip-flops DFF21 and DFF22.

Figure 3A:
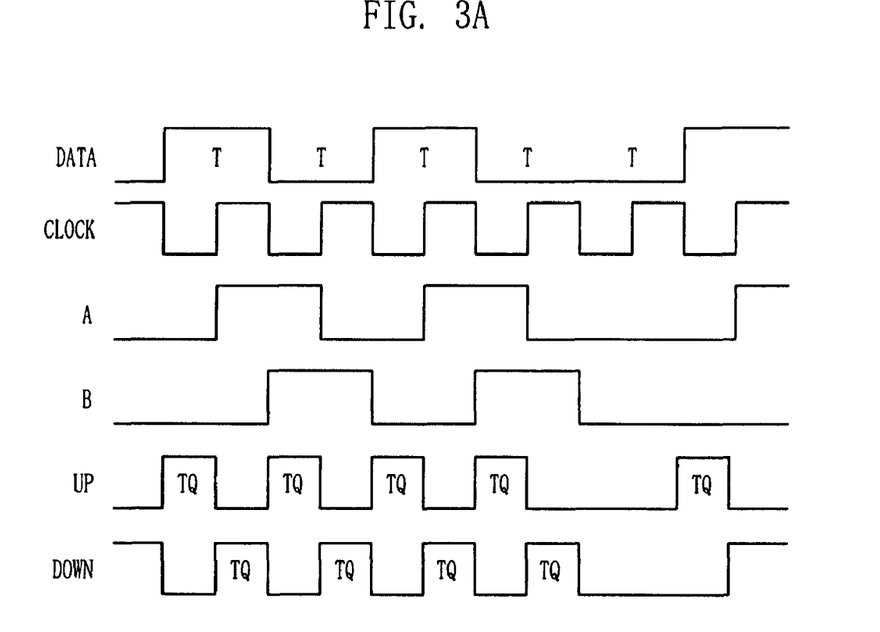
FIGS. 3A to 3C are timing charts showing an operation of the phase detector of FIG. 2.

Referring to FIG. 3A, in case that the rising edge of the clock signal is arranged in the middle of the data pulse, the increment signal (UP) outputted from the phase detector 130 is out of phase with the decrement signal (DOWN) by a half-period. Accordingly, since the charging and discharging currents from the charge pump 140 are the same in the amount and the voltage which is applied to the voltage controlled delay line 120 is constant, the amount of delay in the voltage controlled delay line 120 does not vary. Namely, the locking is achieved.

Figure 3B:
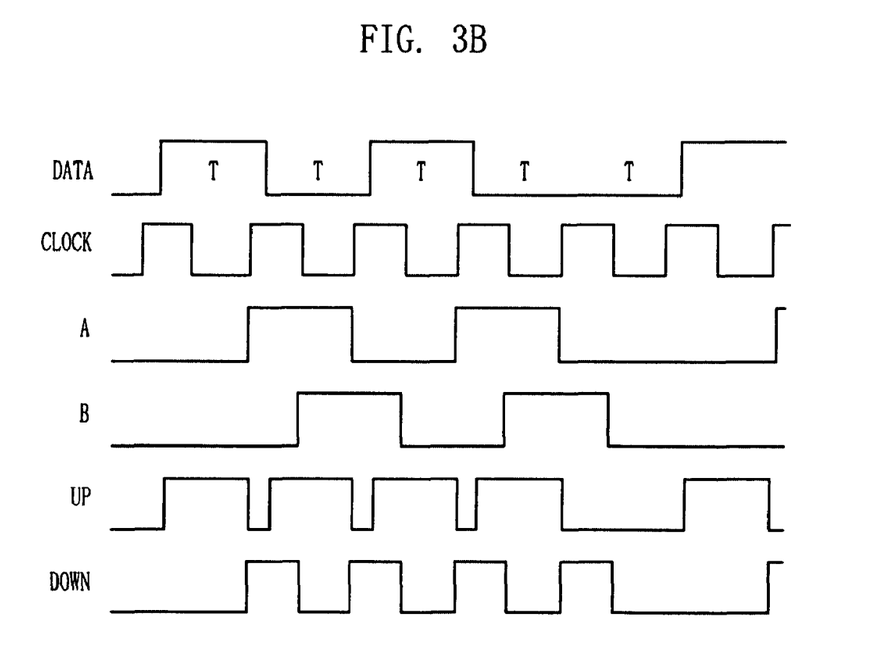

Referring to FIG. 3B, in case that the rising edge of the clock signal lags behind the middle of the data pulse, the pulse width of the increment signal (UP) may be larger than that of the decrement signal (DOWN) (in this case, the decrement signal (DOWN) is maintained with a constant width). Accordingly, the amount of the charging current outputted from the charge pump 140 is more than that of the discharging current and the voltage which is applied to the voltage controlled delay line 120 is relatively high. Eventually, the voltage controlled delay line 120 makes the phase of the clock signal faster by controlling the amount of the delay.

Figure 3C:
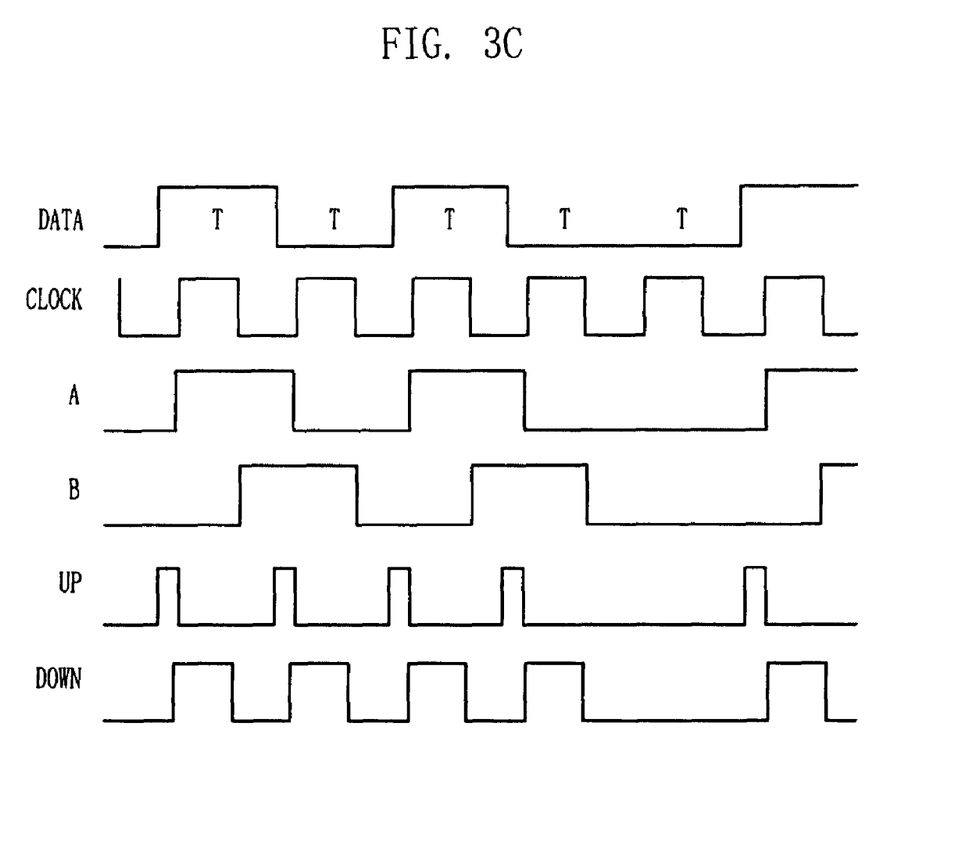

Contrary to the phase of FIG. 3B, FIG. 3C shows a case that the rising edge of the clock signal leads the middle of the data pulse. In this case, the voltage which is applied to the voltage controlled delay line 120 is increased and the voltage controlled delay line 120 controls the phase of the clock signal to be arranged in the middle of the data pulse.

As mentioned above, the conventional data recovery apparatus employs the phase detector 130 as a means for comparing the phase of the clock signal with that of the data. However, with the increment of the frequency in the clock signal, the pulse width of the increment and decrement signals becomes narrower. The decrement in the pulse width of the increment and decrement signals makes a current flowing time of the charging and discharging currents short so that a variation in the voltage which is applied from the loop filter 150 to the voltage controlled delay line 120 is insignificant. This makes the data recovery apparatus unstable with a locking failure.

To overcome this problem, a clock dividing technique, which divides the clock signal at ½ or ¼ rate, is used; however, this technique still has a demerit in that it is difficult to obtain a sufficient pulse width of the increment and decrement signals.

SUMMARY OF THE INVENTION

Embodiments of the present invention are directed to providing a clock data recovery apparatus capable of stably operating in high frequency clocks.

In accordance with an aspect of the present invention, a clock data recovery apparatus includes a phase looked loop unit for outputting a plurality of clock signals which are different from each other in phase and of which frequency is lower than that of data, a voltage control delay line for outputting recovered clock signals by delaying the plurality of clock signals according to input voltage levels, a phase detection unit for outputting a plurality of recovered data in synchronization with the clock signals, respectively and for outputting a plurality of pairs of an increment signal and a decrement signal which have wider pulse width than the data by comparing the recovered clock signals with the data, a charge pump unit for outputting a corresponding current in response to the plurality of pairs of the increment signal and the decrement signal, and a loop filter unit for determining an amount of delay in the voltage control delay line by outputting a voltage having a slight slope using the corresponding current.

DESCRIPTION OF SPECIFIC EMBODIMENTS

Hereinafter, a semiconductor memory device in accordance with the present invention will be described in detail referring to the accompanying drawings.

Figure 4:
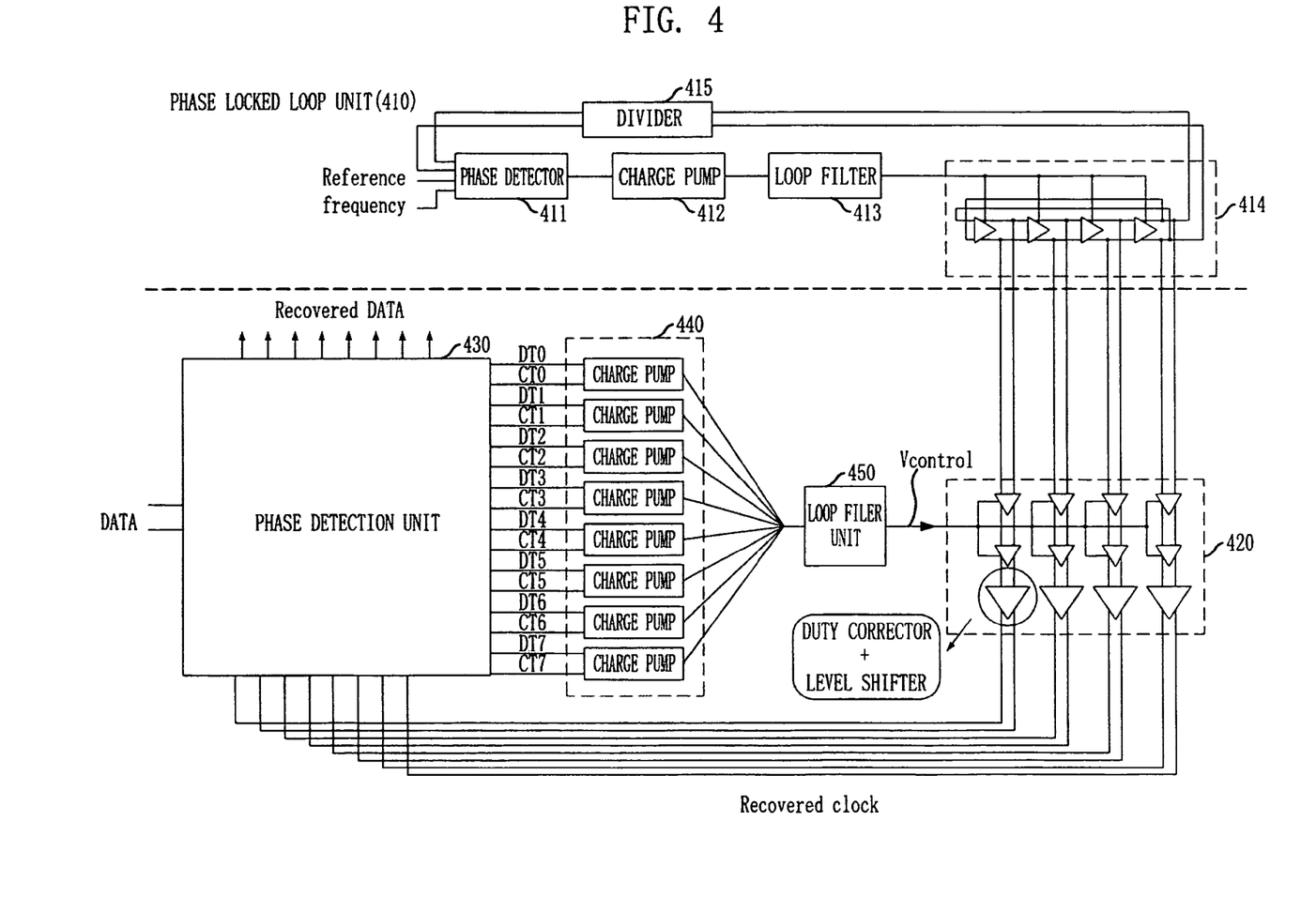
FIG. 4 is a block diagram illustrating a clock data recovery apparatus according to one embodiment of the present invention.

FIG. 4 is a clock data recovery apparatus according to the present invention. As shown in FIG. 4, the clock data recovery apparatus according to the present invention includes a phase locked loop unit 410, a voltage control delay line 420, a phase detection unit 430, a charge pump unit 440 and a loop filter unit 450.

The operation frequency of the phase locked loop unit 410 is lower than that of a data and the phase locked loop unit 410 outputs a plurality of clock signals. For example, if the frequency of the data DATA is 8 Ghz, the phase locked loop unit 410 has an operation frequency of 1 Ghz and outputs eight clock signals each of which is out of phase with each other. The phase locked loop unit 410, which is similar to a conventional PLL, includes a phase detector 411, a charge pump 412, a loop filter 413, a voltage control oscillator 414 and a divider 415. The plurality of clock signals which are out of phase with each other can be produced by combining output signals from a ring-oscillator which are serially connected to each other. This configuration is well known to those skilled in the art.

The voltage control delay line 420 delays the plurality of clock signals from the phase locked loop unit 410 based on voltage levels provided from the loop filter unit 450 and outputs the delayed clock signals. The loop filter unit 450 outputs a voltage signal as information about the relationship between data DATA and the clock signal. The voltage control delay line 420 makes the phase of the clock signal advanced by controlling an amount of delay when the control voltage Vcontrol is relatively high, and makes the phase of the clock signal delayed by controlling the amount of delay when the control voltage Vcontrol is relatively low. As a result, the plurality of recovered clock signals of which the rising edges are arranged in the middle of the data pulse are outputted by the voltage control delay line 420.

In addition, a duty corrector and a level shifter may be included in an output terminal of the voltage control delay line 420. The duty corrector may correct the duty of clock signal in order to guarantee the accuracy of the clock duty and the level shifter may be used for making the operations of the phase detection unit 430 and the voltage control delay line 420 guaranteed in a common mode by controlling output voltage levels.

The phase detection unit 430 receives a plurality of recovered clock signals from the voltage control delay line 420 and the data DATA from an external circuit and then outputs a plurality of recovered data in synchronization with other clock signals and also outputs a plurality of pairs of increment signals DT0~DT7 and decrement signals CT0~CT7 of which the width is wider than that of the data pulse.

The phase detection unit 430 serially receives the data from the external circuit. Thereafter, the phase detector 430 latches the data based on the plurality of the recovered clock signals from the voltage control delay line 420 and further latches the latched data based on the recovered clock signals, thereby outputting the plurality of the recovered data. That is, the phase detection unit 430 which receives the data serially outputs, in parallel, the recovered data in synchronization with the recovered clock signals each of which is out of phase with each other and has low frequency as compared to the data. For example, when the frequency of the data is 8 Ghz and the inner frequency used in the clock data recovery apparatus is 1 Ghz, the sequentially inputted data are outputted through eight output ports in synchronization with eight recovered clock signals each of which is out of phase with each other.

The charge pump unit 440 receives the plurality of pairs of the increment signals DT0~DT7 and the decrement signals CT0~CT7 from the phase detection unit 430 and outputs current to the loop filter unit 450 according to the increment signals DT0~DT7 and the decrement signals CT0~CT7. More concretely, the charge pump unit 440 outputs a charging current to increase a control voltage Vcontrol of the loop filter unit 450 when the increment signals DT0~DT7 are inputted and the charge pump unit 440 outputs a discharging current to decrease the control voltage Vcontrol of the loop filter unit 450 when the decrement signals CT0~CT7 are inputted. As shown in FIG. 4, the charge pump unit 440 can include a lot of charging units CHARGE PUMP corresponding to the number of pairs of the increment signals DT0~DT7 and the decrement signals CT0~CT7.

The loop filter unit 450 determines an amount of delay by outputting to the voltage control delay line 420 a voltage with a smooth variation which is converted by the current from the charge pump unit 440. Concretely, the loop filter unit 450 increases the voltage level of the control voltage Vcontrol when the charging current is inputted from the charge pump unit 440 and decreases the voltage level of the control voltage Vcontrol when the discharging current is inputted from the charge pump unit 440.

Figure 5:
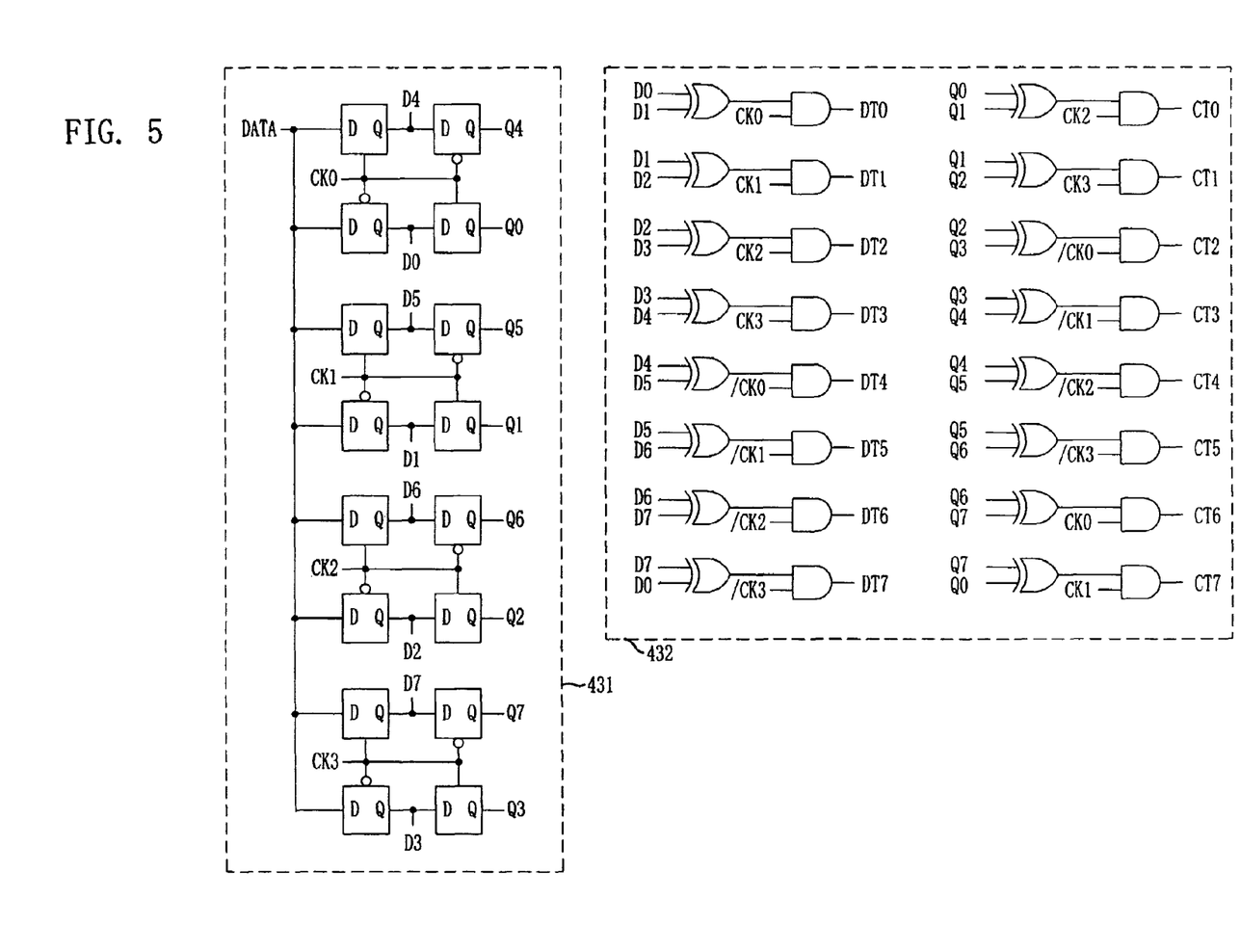
FIG. 5 is a block diagram illustrating a phase detection unit in the clock data recovery apparatus of FIG. 4.

FIG. 5 is a block diagram illustrating the phase detection unit 430 in the clock data recovery apparatus of FIG. 4. As shown in FIG. 5, the phase detection unit 430 includes a latch unit 431 to latch the data DATA in response to the plurality of clock signals CK0 to CK7 and then output the recovered data Q0 to Q7 by latching again the latched data D0 to D7 in response to the plurality of clock signals CK0 to CK7 and a phase output unit 432 to output the increment signals DT0 to DT7 by logically combining the data D0 to D7, which are firstly latched in the latch unit 431, and the plurality of clock signals CK0 to CK7 and to output the decrement signals CT0 to CT7 by logically combining the data Q0 to Q7, which are secondly latched in the latch unit 431, and the plurality of clock signals CK0 to CK7.

The phase detection unit 430 is illustrated in the case that the data frequency is eight times higher than the clock frequency. In this case, the phase detection unit 430 recovers the data DATA by using eight clock signals CK0 to CK7 (which are out of phase by 45° with each other) and outputs the increment signals DT0 to DT7 and the decrement signals CT0 to CT7. Also, the bubbles denoted at the clock terminal of D-latches in the latch unit 431 are indicative of an inversion of the input signals and then the clock signal CK4 is an inverted signal of the clock signal CK0 (the clock signals CK4, CK5, CK6 and CK7 are produced by applying the bubbles to the clock signals CK0, CK1, CK2 and CK3, respectively).

The latch unit 431 outputs the firstly latched data DN by latching the data using N+4 clock signal and, wherein the plurality of clock signals are CK0 to CK7, respectively, in order of phase-advanced signals. The recovered data QN are outputted by latching again the firstly latched data QN in response to the N clock signal. That is, an input data is latched in response to a clock signal CK0 (which is correspondent to a clock signal CK8) in order to produce a latched data D4 and the latched data D4 is again latched in response to a clock signal CK4 in order to produce a recovered data Q4.

The phase output unit 432 outputs the increment signals DTN which has a 'high' width in a logic level which starts from a point of time the logic levels of the N-th and (N+1)-th latched data DN and DN+1 are different from each other and ends at a point of time of the falling edge of the N-th clock signal CKN and outputs the decrement signals CTN which has a 'high' width in a logic level which starts from a point of time the logic levels of the N-th and (N+1)-th recovered data 20, QN and QN+1 are different from each other and ends at a point of time of the falling edge of the (N+2)-th clock signal CKN+2.

As shown in FIG. 5, the latch unit 431 includes first D-latches each of which has a D-input terminal to receive the data DATA and outputs the latched data DN in response to corresponding one of the plurality of clock signals CK0 to CKN and second D-latches each of which has a D-input terminal to receive the latched data DATA from each of the first D-latches and outputs the recovered data QN in response to corresponding one of the plurality of clock signals CK0 to CKN.

The phase output unit 432 includes: first XOR gates each of which receives the N-th latched data DN and the (N+1)-th latched data DN+1; first AND gates each of which receives an output of the XOR gate and the N-th clock signal CKN and outputs the N-th increment signal DTN; second XOR gates each of which receives the N-th recovered data QN and the (N+1)-th recovered data QN+1; and second AND gates each of which receives an output of the XOR gate and the (N+2)-th clock signal CKN+2 and outputs the N-th decrement signal DTN.

Figure 6:
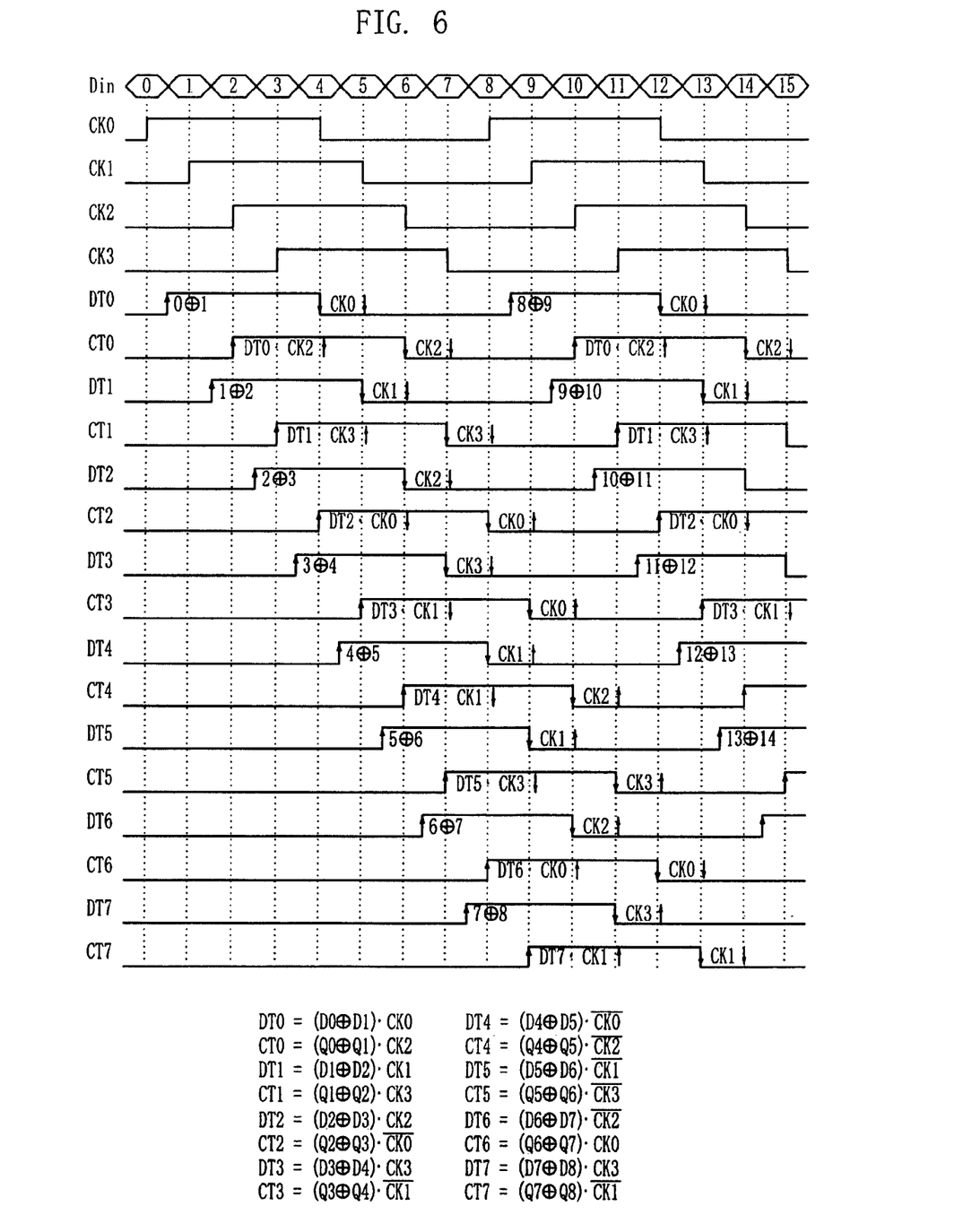
FIG. 6 is a timing chart showing an operation of the phase detection unit of FIG. 5.

FIG. 6 is a timing chart showing an operation of the phase detection unit of FIG. 5.

Referring to FIG. 6, the rising edges of clock signals CK0 to CK3 are respectively arranged in the middle of data Din0 to Din3. This ensures that the width of the decrement signals and increment signals increases as compared to the conventional phase detection unit (the pulse width of the increment signal is 4 times of data pulse width and the pulse width of the decrement signal is 3.5 times of data pulse width).

Referring to the equation shown in the bottom of the timing diagram, the generation of each of the increment signals (DT0 to DT7) and the decrement signals (CT0 to CT7) can be understood in detail.

Figure 7:
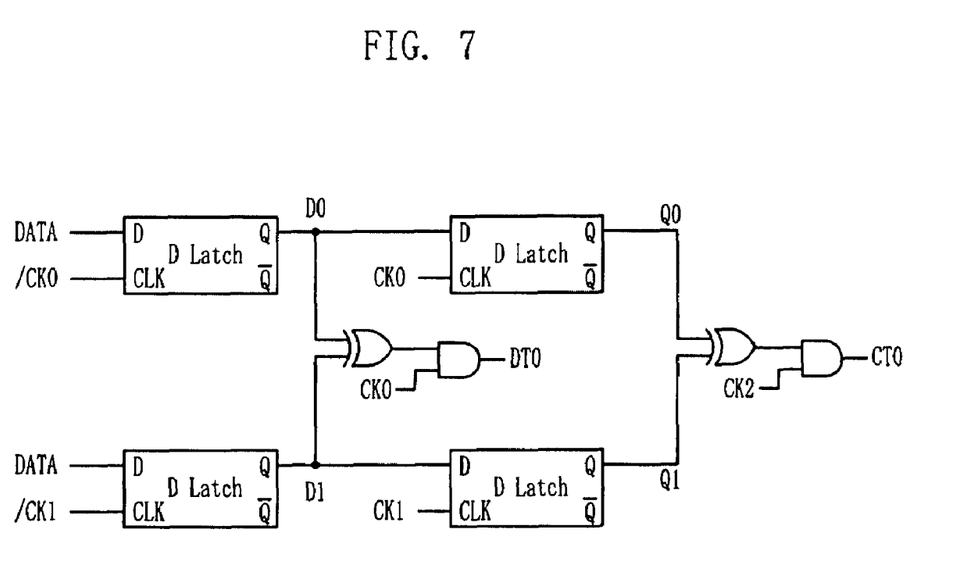
FIG. 7 is a detailed block diagram of a part of the phase detection unit of FIG. 5.

FIG. 7 is a detailed block diagram of a part of the phase detection unit 430 of FIG. 5. Only a part in which data Q0 and Q1 of the plurality of recovered data from the phase detection unit 430 and the increment and decrement signals DT0 and CT0 are produced is shown in FIG. 7. In FIG. 7, only the data Q0 and Q1 of the recovered data which are generated in the phase detection 430 unit of FIG. 5, the increment signal DT0 and the decrement signal CT0 are illustrated.

As described above, to produce the recovered data Q0, the data is once latched in response to the clock signal CK4 (=/CK0) and this latched data is again latched in response to the clock signal CK0. Also, the recovered data Q1 is produced by latching the data in response to the clock signal CK5 (=/CK1) and the clock signal CK1

Moreover, as shown in FIG. 5, the increment signal DT0 is produced by logically combining the signals from the output terminals Q0 and Q1 and the clock signal CK1, and the decrement signal CT0 is produced by logically combining the signals from the output terminals Q0 and Q2 and the clock signal CK2.

Figure 8A:
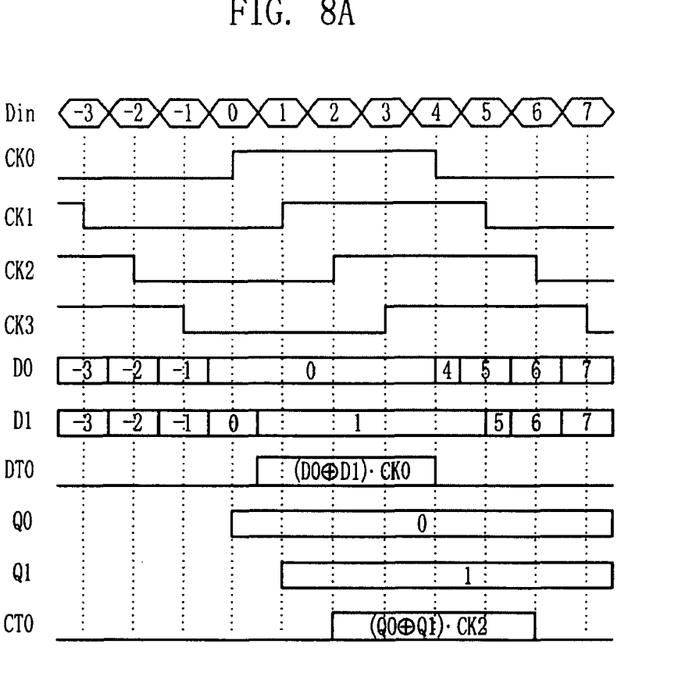
FIGS. 8A to 8C are timing charts showing an operation of the phase detection unit of FIG. 7.

FIG. 8A is a timing chart showing an operation of the phase detection unit of FIG. 7 when the rising edge of the clock signal is arranged in the middle of the data pulse.

In case that the rising edge of a clock is arranged in the middle of data so that the clock data recovery apparatus is in the locking mode, the increment signal DT0 has a pulse width 3.5 times of the data pulse and the decrement signal CT0 has a pulse width 4 times of the data pulse.

That the clock data recovery apparatus is locked makes it unnecessary to change the phase of the clock signal. This means that the control voltage Vcontrol, which is applied to the voltage control delay line 420 to change of phase of the clock signal, should be kept constant.

In order to make the voltage value inputted to the voltage control delay line 420 constant, the charging and the discharging are set up in the same amount of current from the charge pump unit 440. In case that the widths of the increment signal and the decrement signal respectively are A and B, the above-mentioned same current is achieved by setting up the charging and discharging currents, which are outputted by the charge pump unit 440, in response to the increment and decrement signals at a ratio of B to A. That is, as shown in FIG. 8A, since the increment signal and the decrement signal have a ratio of 3.5:4 in the width, the charging and discharging currents which are outputted by the charge pump unit 440 may be set up at a ratio of 4:3.5 at the time of the locking of the phase detection unit.

Figure 8B:
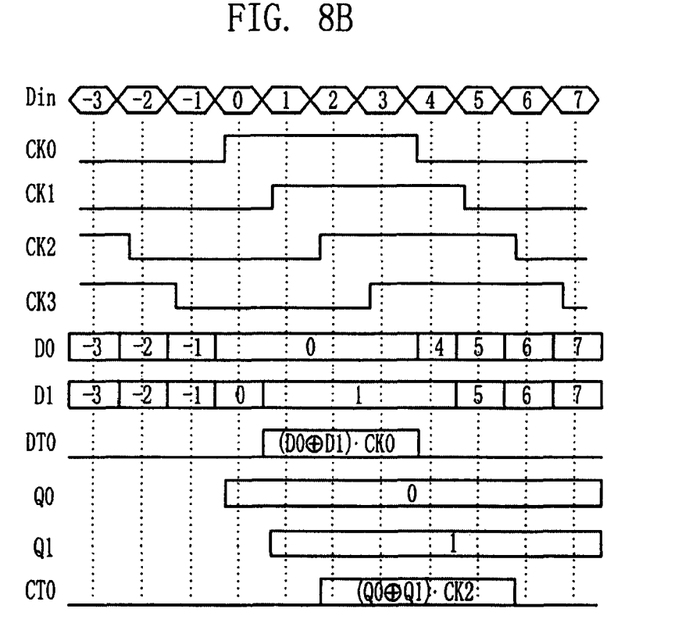

FIG. 8B is a timing chart showing an operation of the phase detection unit of FIG. 7 when the rising edge of the clock signal leads the middle of the data pulse.

As shown in FIG. 8B, in case that the rising edge of the clock signal leads the middle of the data pulse, the pulse width of the increment signal DT0 is reduced and the pulse width of the decrement signal CT0 is kept constant. Accordingly, an amount of discharging current from the charge pump unit 440 is more than that of charging current from the charge pump unit 440 and then the voltage level (Vcontrol) applied to the voltage control delay line 420 becomes low. That is, the pulse width of the decrement signal is kept constant, but the level of the voltage (Vcontrol) may be changed because the pulse width of the increment signal is changed by the phase.

Figure 8C:
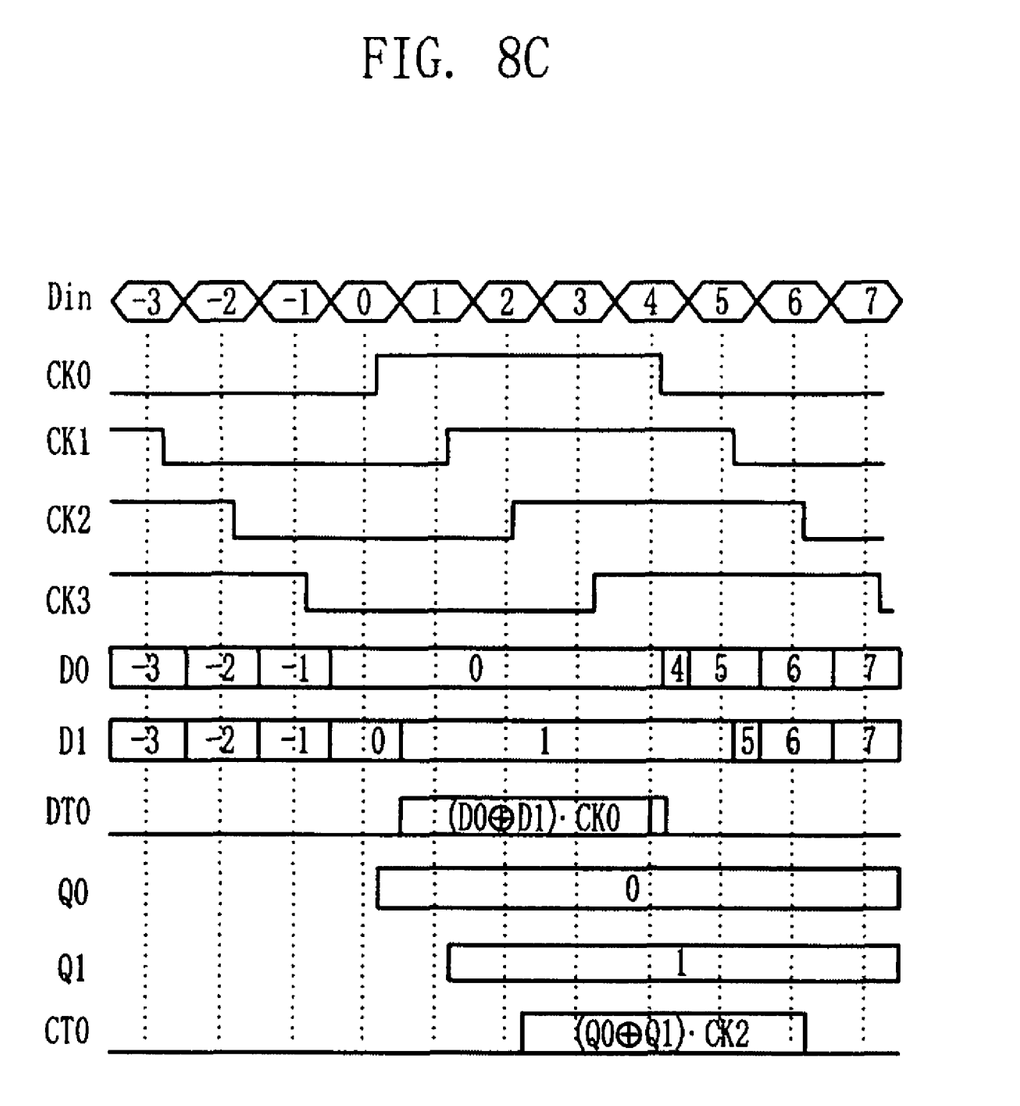

FIG. 8C is a timing chart showing an operation of the phase detection unit of FIG. 7 when the rising edge of the clock signal lags behind the middle of the data pulse.

As shown in FIG. 8C, in case that the rising edge of the clock signal lags behind the middle of the data pulse, the pulse width of the increment signal DT0 increases and the pulse width of the decrement signal CT0 is kept constant. Accordingly, an amount of charging current from the charge pump unit 440 is more than that of discharging current from the charge pump unit 440 and then the voltage level (Vcontrol) applied to the voltage control delay line 420 becomes high.

As apparent from the above, the present invention has an advantage that the clock signal having the frequency lower than the frequency of data is used in the clock data recovery apparatus. Also, the clock data recovery apparatus steadily can operate in the high frequency because of broadening the width of the decrement signal and the increment signal outputted from the phase detection unit.

While the present invention has been described with respect to the particular embodiments, it will be apparent to those skilled in the art that various changes and modifications may be made without departing from the spirit and scope of the invention as defined in the following claims.

What is claimed is:

1. A clock data recovery apparatus comprising:
   a phase locked loop unit for outputting a plurality of clock signals having frequencies that are different from each other and lower than a frequency of data;
   a voltage control delay line for outputting recovered clock signals that are obtained by delaying the plurality of clock signals according to input voltage levels;
   a phase detection unit for outputting a plurality of recovered data in synchronization with the clock signals, respectively, and for outputting a plurality of increment signals and a plurality of decrement signals in response to a comparison of the recovered clock signals with the data, wherein the plurality of increment signals and the plurality of decrement signals have wider pulse widths than the data;
   a charge pump unit for driving current in response to the plurality of the increment signals and the plurality of decrement signals; and
   a loop filter unit for determining an amount of delay in the voltage control delay line by outputting a voltage according to the current,
   wherein the phase detection unit includes a latch unit for firstly latching the data in response to the plurality of clock signals, secondly latching the firstly latched data in response to the plurality of the clock signals, and outputting the secondly latched data as the plurality of recovered data.

2. The clock data recovery apparatus of claim 1, wherein the phase detection unit further comprises:
   a phase output unit for outputting the plurality of increment signals by logically combining the firstly latched data in the latch unit and the plurality of clock signals and for outputting the plurality of decrement signals by logically combining the plurality of recovered data in the latch unit and the plurality of clock signals.

3. The clock data recovery apparatus of claim 1, wherein, when the data frequency is M times faster than the clock frequency, zeroth through n-th clock signals that are numbered in the order of phase advances are provided as the plurality of clock signals, and M and n are each a natural number greater than one, for each N-th clock signal with the N ranging from zero to less than M/2, the latch unit is configured to firstly latch the data according to (N+M/2)-th clock signal, output the firstly latched data for the N-th clock signal as N-th firstly latched data and secondly latch the N-th firstly latched data according to the N-th clock signal, and output the secondly latched data for the N-th clock signal as the N-th recovered data.

4. The clock data recovery apparatus of claim 3, wherein the phase output unit is configured to output N-th increment signal having a 'high' pulse that starts from when logic levels of the N-th and (N+1)-th firstly latched data are different from each other and ends at the falling edge of the N-th clock signal and outputs N-th decrement signal having a 'high' pulse that starts when the logic levels of the N-th and (N+1)-th recovered data are different from each other and ends at the falling edge of (N+2)-th clock signal.

5. The clock data recovery apparatus of claim 3, wherein the latch unit includes:
   first D-latches each of which has a D-input terminal to receive the data and outputs the N-th firstly latched data in response to the (N+M/2)-th clock signal; and
   second D-latches each of which has a D-input terminal to receive the N-th firstly latched data from each of the first D-latches and outputs the N-th recovered data in response to the N-th clock signal.

6. The clock data recovery apparatus of claim 4, wherein the phase output unit includes:
   first XOR gates for performing a logic operation on the N-th firstly latched data and the (N+1)-th firstly latched data;
   first AND gates for outputting the N-th increment signal by performing a logic operation on an output of the corresponding first XOR gate and the N-th clock signal;
   second XOR gates for performing a logic operation on the N-th recovered data and the (N+1)-th recovered data; and
   second AND gates for outputting the N-th decrement signal by performing a logic operation on an output of the corresponding second XOR gate and the (N+2)-th clock signal.

7. The clock data recovery apparatus of claim 1, wherein the charge pump unit, when pulse widths of the increment signal and the decrement signal respectively are A and B and the clock data recovery apparatus is in a locked mode, is configured to set up a charging current and a discharging current at a ratio of B to A.

8. The clock data recovery apparatus of claim 1, wherein the phase locked loop unit includes a phase detector, a charge pump, a loop filter, a voltage control oscillator and a divider,
   wherein the plurality of clock signals which are out of phase with each other are output signals from ring-oscillators that are serially connected in the voltage control oscillator.

9. The clock data recovery apparatus of claim 1, wherein the charge pump unit includes a number of charge pumps, where the number is the same as a numbers of the increment signals or a number of the decrement signals.

10. The clock data recovery apparatus of claim 1, further comprising:
    a duty corrector for correcting a duty cycle of the clock signals at an output terminal of the voltage controlled delay line; and
    a level shifter for shifting a level of an output voltage level.

11. The clock data recovery apparatus of claim 1, wherein the latch unit includes a first latch for firstly latching the data in response to the plurality of clock signals and a second latch for secondly latching the firstly latched data in response to the plurality of the clock signals.

* * * * *